United States Patent
Nakazato

(10) Patent No.: US 7,719,880 B2
(45) Date of Patent: May 18, 2010

(54) METHOD AND SYSTEM FOR SEMICONDUCTOR MEMORY

(75) Inventor: Takaaki Nakazato, Kanagawa-ken (JP)

(73) Assignee: Toshiba America Electronic Components, Inc., Irvine, CA (US)

( * ) Notice: Subject to any disclaimer, the term of this patent is extended or adjusted under 35 U.S.C. 154(b) by 277 days.

(21) Appl. No.: 12/029,731

(22) Filed: Feb. 12, 2008

(65) Prior Publication Data

US 2009/0201719 A1    Aug. 13, 2009

(51) Int. Cl.
*G11C 11/00* (2006.01)

(52) U.S. Cl. ............ 365/156; 365/154; 365/155

(58) Field of Classification Search ........ 365/156, 365/154, 155
See application file for complete search history.

(56) References Cited

U.S. PATENT DOCUMENTS

| | | | |
|---|---|---|---|
| 6,563,730 B1 | 5/2003 | Poplevine et al. | |
| 6,657,878 B2 * | 12/2003 | Lien et al. | 365/49.1 |
| 6,781,857 B1 * | 8/2004 | Lien et al. | 365/49.15 |
| 7,295,458 B2 | 11/2007 | Chan et al. | |
| 7,400,523 B2 * | 7/2008 | Houston | 365/154 |

* cited by examiner

*Primary Examiner*—Pho M. Luu
(74) *Attorney, Agent, or Firm*—Sprinkle IP Law Group

(57) ABSTRACT

Methods and systems for embodiments of a 9T memory cell, memory devices which utilize such 9T memory cells and the creation of embodiments of such memory devices are disclosed. More specifically, an embodiment of a 9T memory cell may comprise a 6T memory cell portion and a 3T read port. Additionally, in one embodiment, a memory which utilizes 9T memory cells may be made by from a grid comprising columns and rows of transistors formed according to a layout for 6T memory cells.

24 Claims, 11 Drawing Sheets

METHOD AND SYSTEM FOR SEMICONDUCTOR MEMORY

TECHNICAL FIELD

Embodiments of the invention relate in general to methods and systems for semiconductor memory, and more particularly, to embodiments of random access memory. Even more particularly, embodiments of the present invention relate to static random access memory cells having nine transistors.

BACKGROUND

In recent years, there has been an insatiable desire for faster computer processing data throughputs because cutting-edge computer applications are becoming more and more complex, placing ever increasing demands on microprocessing systems. The microprocessors in these systems may have very rapid cycle times and be capable of manipulating a great amount of data very quickly. Part and parcel with the increased demand for data throughputs and high power microprocessors is an ever increasing demand for memory to be utilized with these microprocessor devices.

Commensurate with the demand for ever more complicated processing devices and the associated desire for more memory is the desire to have these computing devices (and associated memory) in smaller packages. The competing requirements of increased complexity and smaller form factor may, however, give rise to a number of problems. In particular, with respect to the memory of these devices certain problems may be exacerbated by the reduction in size of the memory (other things being equal). For example, with respect to semiconductor memory, such as static random access memory, as the size of the device (transistor size, distance between transistors, area per given number of transistors, or another measure of size altogether) becomes smaller the instability of the memory may likewise increase, leading to greater number of memory errors and impacting the performance of the memory and hence the device with such memory is utilized.

Thus, a need exists for systems and methods for memories with both increased stability and desirable form factors.

SUMMARY

Methods and systems for a 9T memory cell, memory devices which utilize such 9T memory cells and the creation of such memory devices are disclosed. More specifically, an embodiment of a 9T memory cell may comprise a 6T memory cell portion and a 3T read port.

Specifically in one embodiment, a memory which utilizes 9T memory cells may be made by forming a grid comprising columns and rows of transistors according to a layout for 6T memory cells. In a particular column of 6T memory cells a pair of 9T memory cells may be created by utilizing three of the 6T memory cells in that column. A middle 6T cell may be divided and 3T of a middle set of transistors laid out according to a 6T memory cell may be utilized in conjunction with the 6T memory cell in the row above to form one 9T memory cell while the other 3T of the middle set of transistors may be utilized in conjunction with the 6T memory cell in the row below to form another 9T memory cell. Specifically, the 3T of the middle set of transistors laid out according to a 6T memory cell is used as a 3T read port of the first 9T memory cell (formed from the 6T memory cell of the row above) and the other 3T of the middle set of transistors laid out according to a 6T memory cell is used as a 3T read port of the second 9T memory cell (formed from the 6T memory cell of the row above). Thus a memory device comprising a grid of 9T cells can be formed using a sets of transistors laid out according to a set of 6T memory cells.

Embodiments of the present invention may provide the technical advantage of having memory cells which have increased stability and encompass a desired number of metal wiring tracks of a memory device without sacrificing transistor density within the memory cell. Furthermore, by utilizing a 3T read port an additional P-type metal-oxide-semiconductor field-effect transistor (PMOS) may be utilized in conjunction with a read port, ameliorating charge distribution during read operations and increasing stability of the 9T memory cell.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. Skilled artisans should understand, however, that the detailed description and the specific examples, while disclosing preferred embodiments of the invention, are given by way of illustration only and not by way of limitation. Various substitutions, modifications, additions or rearrangements within the scope of the underlying inventive concept(s) will become apparent to those skilled in the art after reading this disclosure.

Initially, before delving into details about specific embodiments of the invention, a general overview of embodiments of semiconductor memory may be helpful. In particular it may be useful to review embodiments of semiconductor memory, including static random access memory (SRAM). However, while embodiments of SRAM will be described and embodiments of the present invention may be especially useful in conjunction with the implementation of SRAM, it should be noted that other embodiments of the present invention may also be useful in the implementation of other types of semiconductor memory or semiconductor devices.

Figure 1:
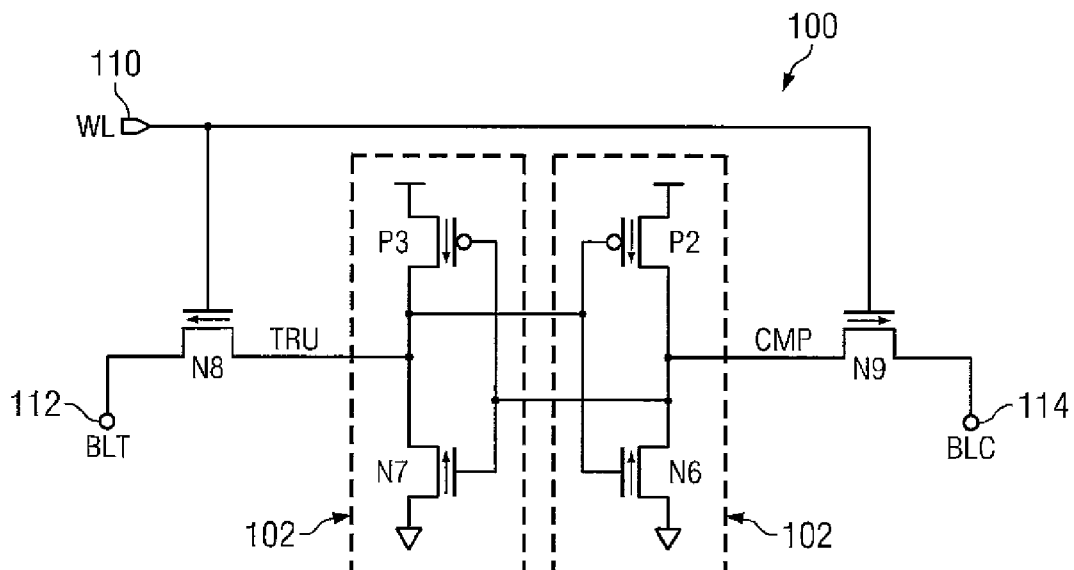
FIG. 1 depicts one embodiment of a memory cell.

Turning now to FIG. 1, a schematic for one embodiment of a 6 transistor (T) memory cell is depicted. 6T memory cell 100 comprises two cross-coupled inverters 102 operable to store data when wordline (wl) 110 is asserted (e.g. at a high, low or other voltage depending on the architecture of the memory). Data is read or written into the 6T memory cell 100 using bitline 112 (blt) and bitline 114 (blc). For example, a "1" may be written into 6T memory cell 100 by forcing bitline 112 high, while data may be read from 6T memory cell 100 by precharging both bitline 112 and bitline 114 and determining which bitline 112, 114 becomes discharged.

As memory sizes shrink, however, the instability of 6T memory cell 100 may become increasingly problematic. More specifically, in certain cases as the distance between transistors within 6T memory cell 100 becomes smaller and the distance between 6T memory cells 100 in a memory device also becomes smaller, effects from the operation of transistors within 6T memory cell 100 or the operation of other 6T memory cells in close proximity may result in instability of the data within 6T memory cell 100 during use in a memory device. In particular, the act of reading from 6T memory cell 100 may cause instability of data within the 6T memory cell 100, for example, because reading of data from 6T memory cell 100 may entail a charging of bitlines 112, 114 coupled to inverters 102 storing data in 6T memory cell 100.

Figure 2:
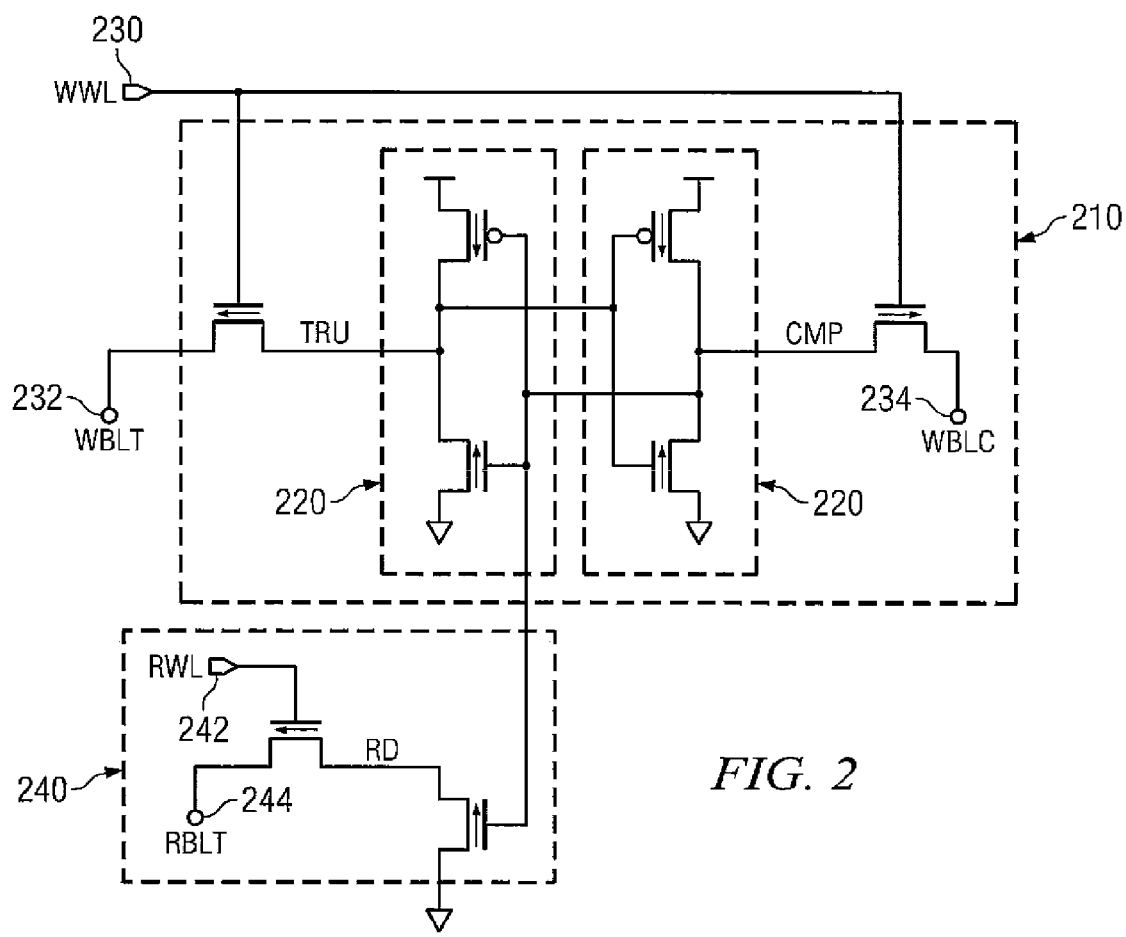
FIG. 2 depicts one embodiment of a memory cell.

To ameliorate at least a portion of these problems then, it is possible to utilize separate wordlines or ports for read and write operation. FIG. 2 depicts a schematic for one embodiment of just such a memory cell. 8T memory cell 200 comprises a 6T memory cell portion 210 having two cross-coupled inverters 220 a write wordline (wwl) 230 and two write bitlines 232, 234. 8T memory cell 200 also comprises a read port 240 having a read wordline (rwl) 242 and a read bitline 244. Data is written to 8T memory cell 200 using write wordline 230, write bitline 232 (wblt) and write bitline 234 (wblc) while data is read from 8T memory cell 200 using read wordline 242 and read bitline 244. Thus, by separating the transistors used for read and write operations with respect to 8T memory cell 200 the stability of 8T memory cell 200 is increased relative to 6T memory cell 100.

These advantages do not come without some form of tradeoff, however, as when utilizing an 8T memory cell 200 the transistor density may be higher in a memory cell than when utilizing 6T memory cell 100 or the area of an 8T memory cell may need to be greater than when utilizing 6T memory cell 100. For example, as the 8T memory cell 200 comprises a traditional 6T memory cell portion 210 (as discussed with respect to FIG. 1) and a 2T read port 240 (which is usually configured with respect to 6T memory cell portion 210 so that 8T memory cell can be formed in a the shape of a rectangle or cell) 8T memory cell 200 may consume more space and may present more difficulties in layout or utilization than 6T memory cell 100.

Figure 3:
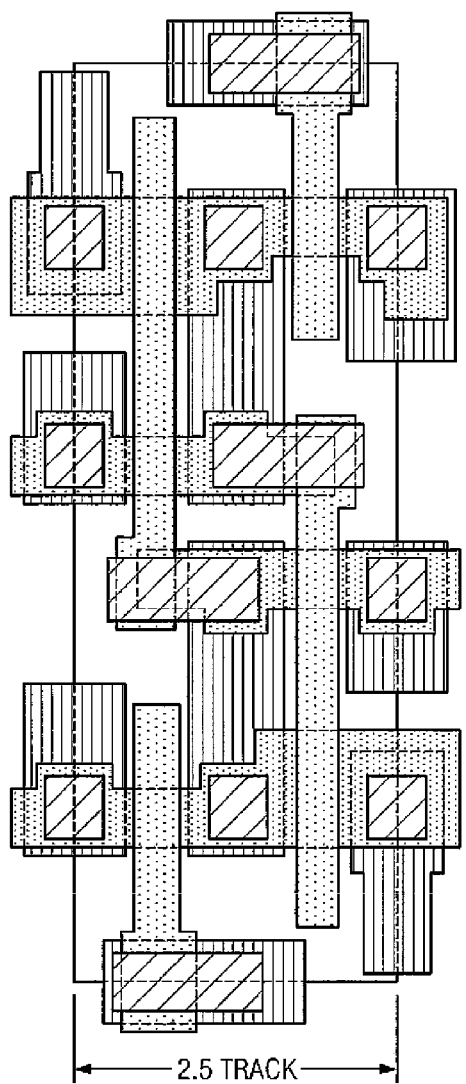
FIG. 3 depicts one embodiment of a layout for memory cells.
Figure 4:
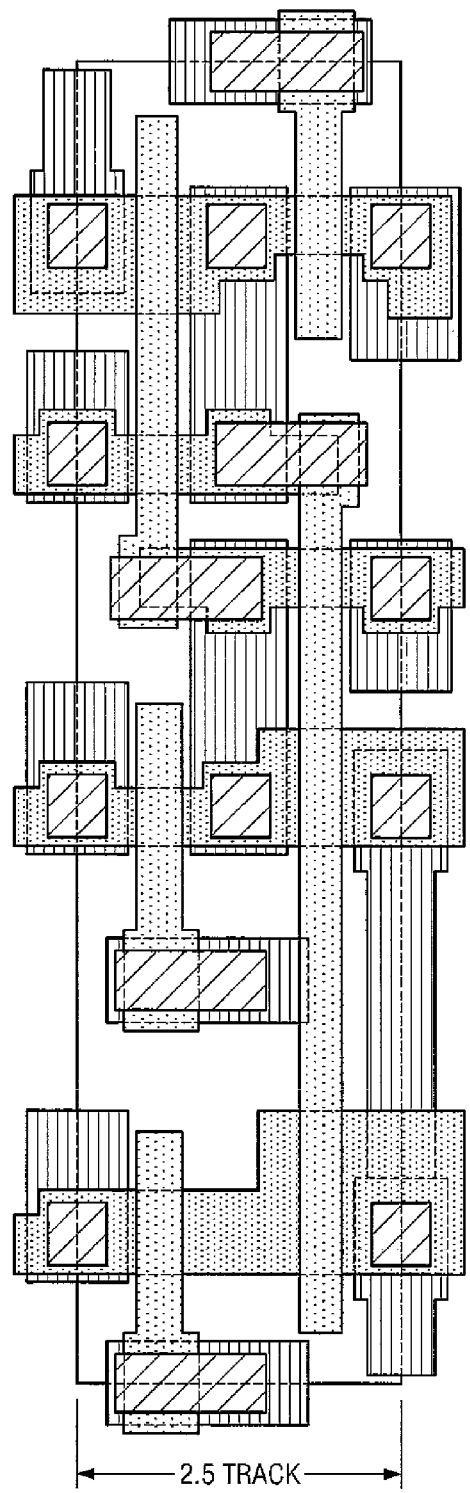
FIG. 4 depicts one embodiment of a layout for memory cells.

The differences between the layout of a semiconductor memory when utilizing a 6T memory cell and the layout of a semiconductor memory when utilizing an 8T memory cell may be illustrated with respect to FIGS. 3 and 4. FIG. 3 depicts a block diagram of the layout of a memory device using 6T memory cells as discussed in FIG. 1 while FIG. 4 depicts a block diagram of the layout of a memory device utilizing 8T memory cells as discussed in FIG. 2. In both FIGS. 3 and 4 the direction of the wordlines of the respective memory cells is in the horizontal direction while the orientation of the bitlines of the memory cells is vertical.

The layout issues discussed above may be particularly germane when it comes to the use of metal wiring tracks within a semiconductor memory which utilizes these types of cells. In particular, 8T memory cell 200 has multiple wordlines, one for write operations and the other for read operations.

Figure 5:
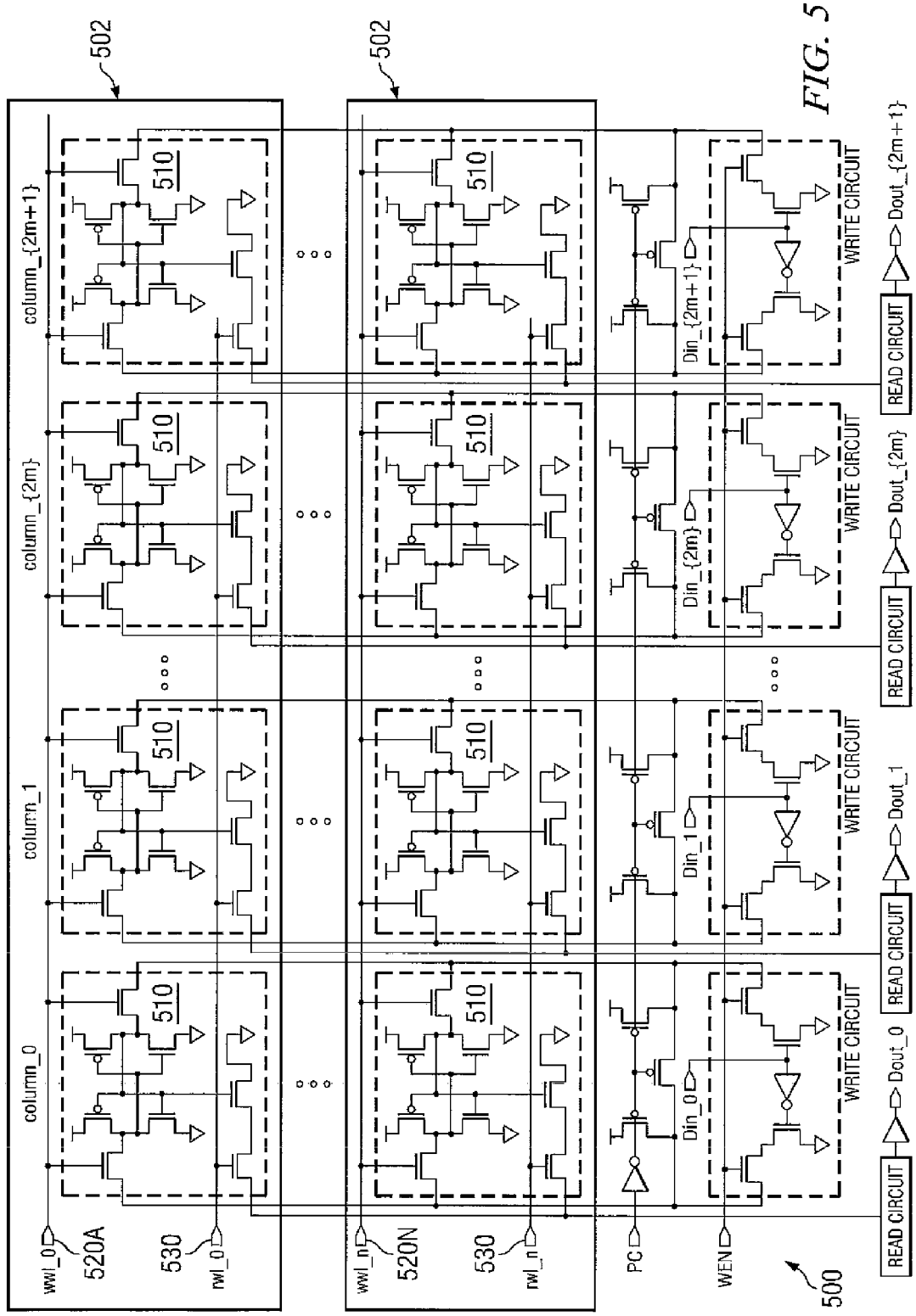
FIG. 5 depicts one embodiment of a memory.

The use of multiple wordlines in a memory device utilizing 8T memory cells is illustrated more clearly with reference to FIG. 5 which depicts a schematic diagram of one embodiment of just such a memory. Memory device 500 comprises rows of 8T memory cells 510, each row 502 of 8T memory cells 510 coupled to a corresponding write wordline 520 for use in writing to 8T memory cells 510 of that row 502 and corresponding read wordline 530 for use in reading from 8T memory cells 510 of that row 502. Metal wiring tracks (not shown) within memory 500 are used to carry signals to or from write wordlines 520 and read wordlines 530. Thus, assuming that each wordline 520, 530 will utilize a single metal wiring track within memory 500 the height of 8T memory cells 510 must encompass two or more metal wiring tracks.

As can be seen from looking again at FIG. 4, in the current technology a ratio of 2.5 metal tracks per cell (encompassed by the height of one cell) may be the norm and thus the use of 8T memory cells 510 may be possible. However, as transistor size becomes smaller it is likely the case that fewer and fewer metal wiring tracks will be available (per cell) as the width of the metal wiring tracks and the space consumed by these metal wiring tracks does not usually scale in proportion to transistor size (e.g. transistor sizes may shrink much faster than it is possible to shrink the width of the metal wiring tracks or the distance between these metal wiring tracks).

Figure 6:
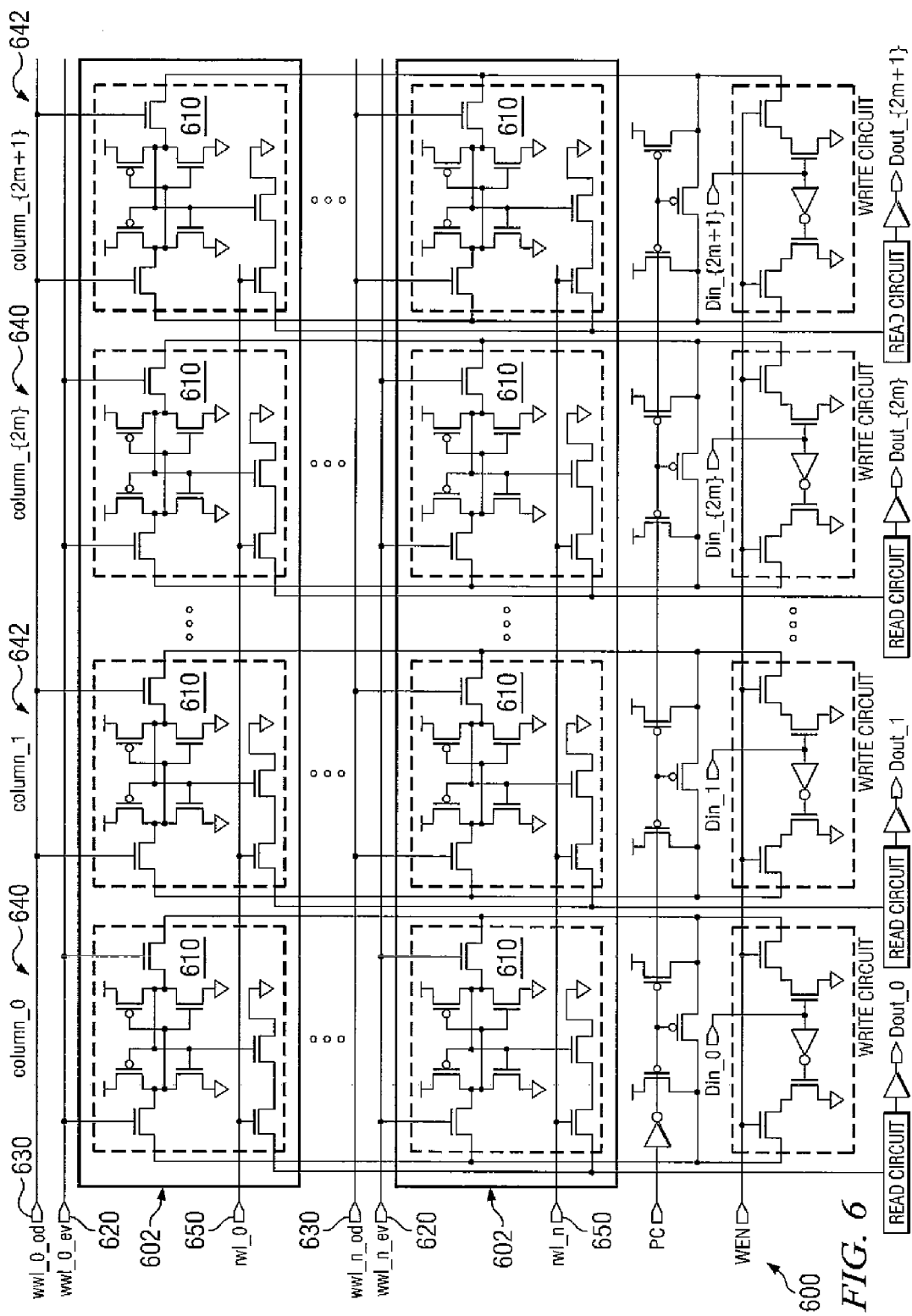
FIG. 6 depicts one embodiment of a memory.

Furthermore, in some cases more than 2 tracks (or 2.5 tracks) per cell may be desired. For example, in certain cases 3 wordlines may be desired for use with a single memory cell (or row of cells). FIG. 6 depicts a schematic one example of such a case. Here memory 600 comprises rows of 8T memory cells 610, each row 602 of 8T memory cells 610 coupled to a first corresponding write wordline 620 for use in writing to 8T memory cells 610 of that row 602 which are in even columns 640, a second corresponding write wordline 630 for use in writing to 8T memory cells 610 of that row 610 which are in odd columns 642 and corresponding read wordline 650 for use in reading from 8T memory cells 610 in that row.

As can be seen then to implement this memory 600 3 metal wiring tracks may be required per cell height (2.5 metal wiring tracks per cell is insufficient). Of course this difficulty may be solved by increasing the height of each memory cell to encompass 3 tracks, but by doing so the transistor density within a given cell area is decreased.

Figure 7:
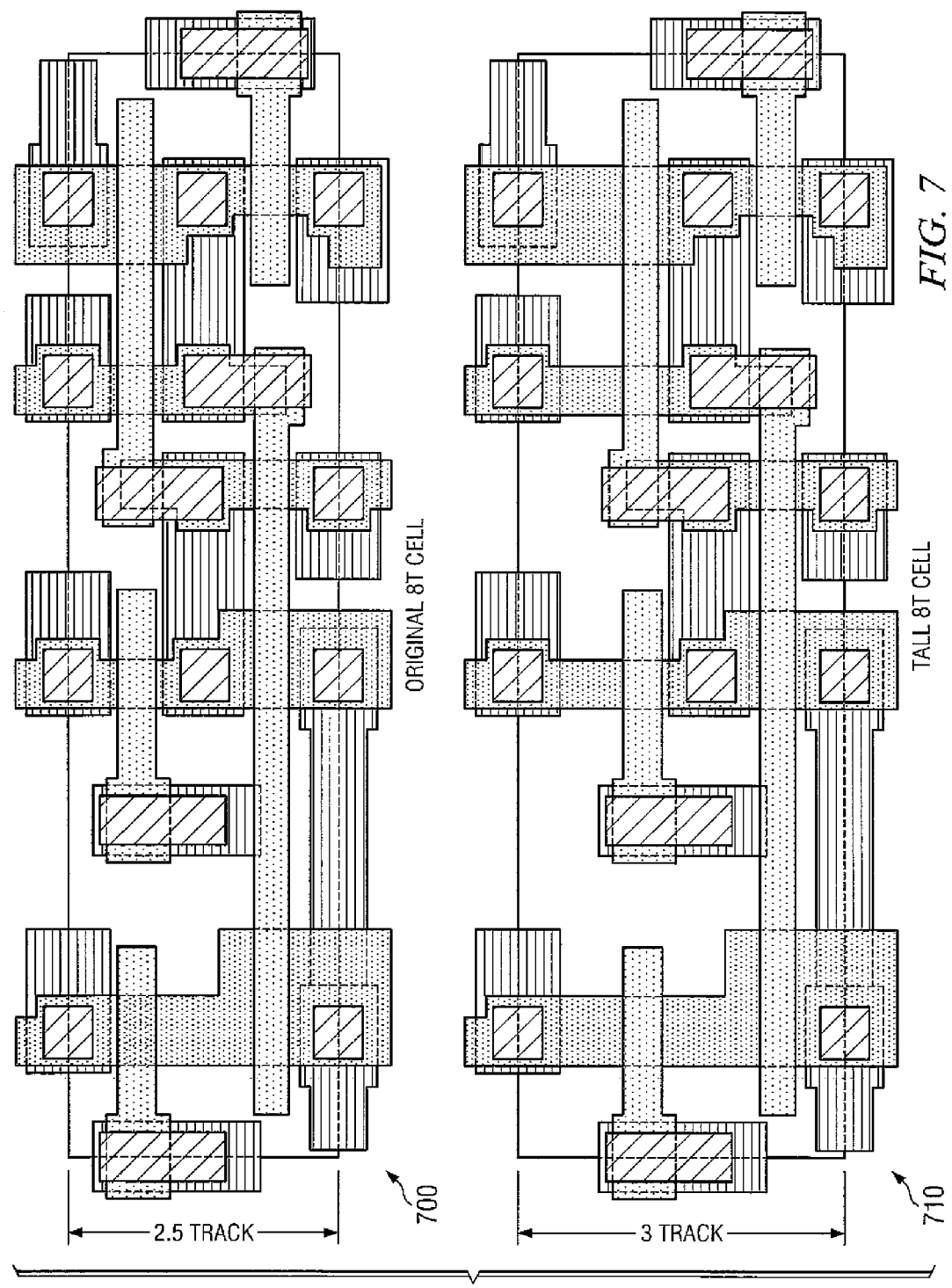
FIG. 7 depicts embodiments of layouts for memory cells.

This effect can be seen with reference to FIG. 7 which depicts one embodiment of a layout 700 of a memory device utilizing 8T memory cells such as those discussed above with respect to FIG. 2 and a layout 710 of a memory device which utilizes "tall" 8T memory cells which have been increased in size such that their height encompasses at least 3 metal wiring tracks.

After reviewing the above, it will be noted that what would be desirable is to have memory cells which have increased stability and may encompass a desired number of metal wiring tracks of a memory device without sacrificing transistor density within the memory cell. To that end, attention is now directed to methods and systems for a 9T memory cell, memory devices which utilize such 9T memory cells and the creation of such memory devices. More specifically, an embodiment of a 9T memory cell may comprise a 6T memory cell portion and a 3T read port. By utilizing a 3T read port an additional P-type metal-oxide-semiconductor field-effect transistor (PMOS) may be utilized in conjunction with the read port, ameliorating charge distribution during read operations and increasing stability of the 9T memory cell.

Additionally, in one embodiment, a memory which utilizes 9T memory cells may be made by forming a grid comprising columns and rows of transistors according to a layout for 6T memory cells. In a particular column of 6T memory cells a pair of 9T memory cells may be created by utilizing three of the 6T memory cells in that column. A middle 6T cell may be divided and 3T of a middle set of transistors laid out according to a 6T memory cell may be utilized in conjunction with the 6T memory cell in the row above to form one 9T memory cell while the other 3T of the middle set of transistors may be utilized in conjunction with the 6T memory cell in the row below to form another 9T memory cell. Specifically, the 3T of the middle set of transistors laid out according to a 6T memory cell is used as a 3T read port of the first 9T memory cell (formed from the 6T memory cell of the row above) and the other 3T of the middle set of transistors laid out according to a 6T memory cell is used as a 3T read port of the second 9T memory cell (formed from the 6T memory cell of the row above). Thus a memory device comprising a grid of 9T cells can be formed using a sets of transistors laid out according to a set of 6T memory cells.

Figure 8:
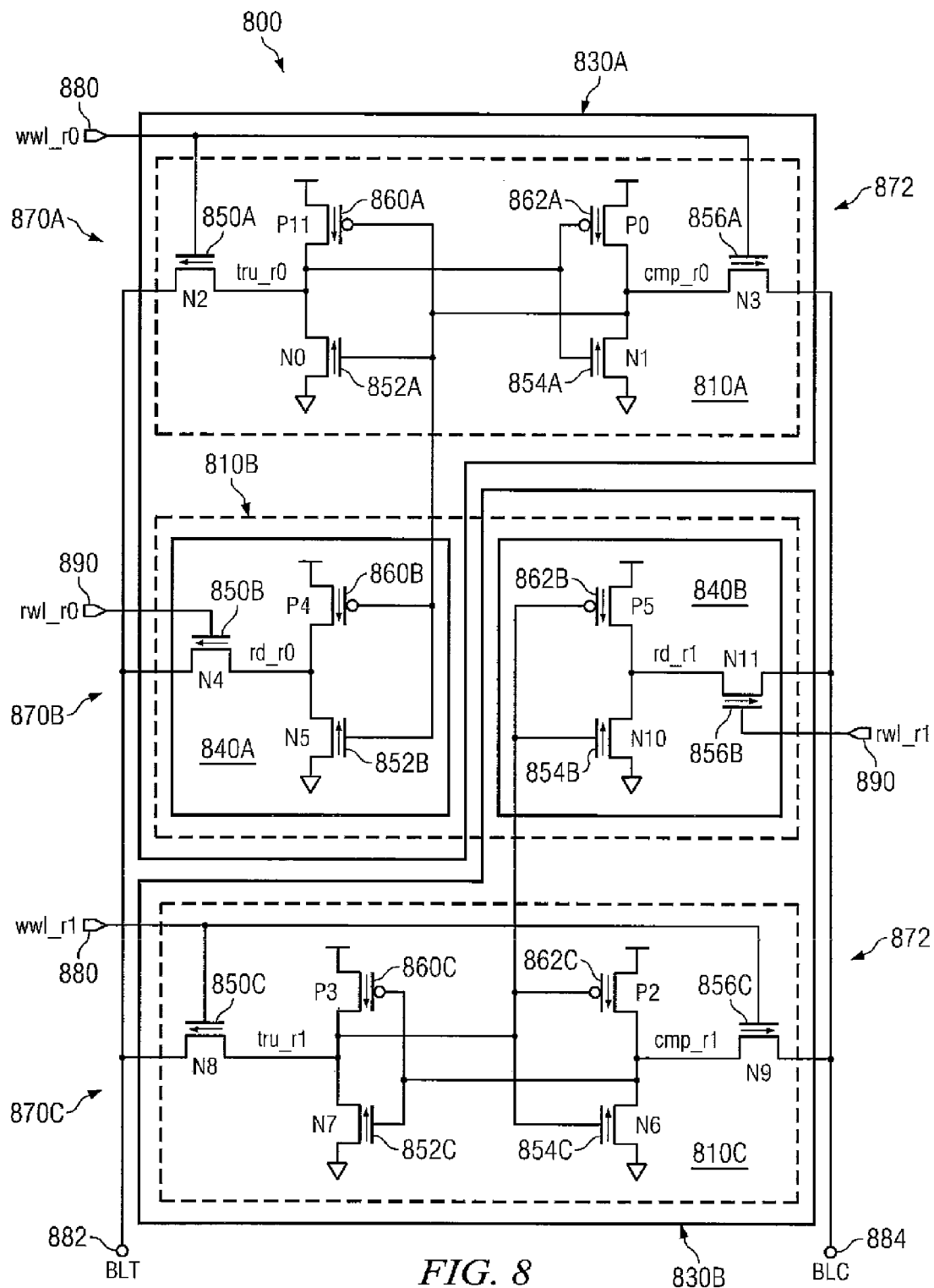
FIG. 8 depicts one embodiment of memory cells.

A schematic of one such embodiment of 9T memory cells created from a layout of transistors according to a 6T memory cell is depicted in FIG. 8. A grid (rows and columns) of cells 810 of transistors may be laid out, where each cell 810 comprises a set of transistors laid out according to a 6T memory cell. 9T memory cells 830 may be created from cells 810 of transistors laid out according to a 6T memory cell. More specifically, in one embodiment, 3 transistors of a middle cell 810*b* of transistors (laid out according to a 6T memory cell) may be coupled to the cell 810*a* of transistors in the row of cells above (with respect to the grid of cell 810) to form 9T memory cell 830*a* while 3 transistors of the middle cell 810*b* of transistors may be coupled to the cell 810*c* of transistors in the row below to form 9T memory cell 830*b*.

To explain in more detail, in one embodiment, each cell 810 of transistors laid out according to the 6T memory cell may comprise N-type MOSFET (NMOS) transistors 850, 852, 854, 856 and PMOS transistors 860, 862. In a first row 870*a* of cells 810 of transistors the cell 810*a* of transistors may be coupled together according to 6T memory cell (such as that described in FIG. 1). In the row 870*b* of cells 810 of transistors below the first row 810*a*, NMOS transistors 850*b*, 852*b* and PMOS transistors 860*b* are coupled to one another as in a 6T memory cell and are additionally coupled to one or both of the cross-coupled inverters of the cell 810*a* of transistors above (e.g. in the same column, proximate row) to form a 3T read port 840*a* for 9T memory cell 830*a*. Similarly, in a third row 870*c* of cells 810 of transistors below the middle row 870*b* (e.g. in the same column, proximate row) a cell 810*c* of transistors may be coupled together according to a 6T memory cell. In the middle row 870*b* of cells 810 of transistors above this third row 870*c*, NMOS transistors 854*b*, 856*b* and PMOS transistors 862*b* are coupled to one another as in a 6T memory cell and are additionally coupled to one or both of the cross-coupled inverters of the cell 810*c* of transistors below them to form a 3T read port 840*b* for 9T memory cell 830*b*. As can be seen then, a pair of 9T memory cells 830*a*, 830*b* may be formed from 3 cells 810 of transistors laid out according to a 6T memory cell, two rows of 9T memory cells (e.g. one row of paired 9T memory cells) may be formed from three rows of cells 810 of transistors laid out according to a 6T memory cell and in general, a memory device of 9T cells may be created from a grid of cells of transistors laid out according to a 6T memory cell.

Furthermore, each of the 9T memory cells 830 is coupled to a write wordline (wwl) 880 and a read wordline (rwl) 890 corresponding to the row 872 of 9T memory cells and two bitlines 882 (blt), 884 (blc) corresponding to the column of that 9T memory cell 830. More specifically, the write wordline 880 corresponding to a row of 9T memory cells and bitlines 882, 884 may be coupled to the 6T memory cell portion 842 of 9T memory cell 830 in the same manner as that of a 6T memory cell. In other words, write wordline 870 may be coupled to NMOS transistors 850, 856 of the 6T portion 842 of 9T memory cell 830, bitline 882 may be coupled to transistor 850 and bitline 884 may be coupled to transistor 856. Additionally, one bitline 872, 874 may be coupled to the 3T read port 840 of each 9T memory cell 830. For example, bitline 882 may be coupled to the 3T read port of 9T memory cells in even rows (for example, here bitline 882 is coupled to transistor 852*b* of 3T read port 840*a* of 9T memory cell 830*a* in row "0"), while bitline 884 may be coupled to the 3T read ports of 9T memory cells in odd rows (for example, here bitline 884 is coupled to transistor 856*b* of 3T read port 840*b* of 9T memory cell 830*b* in row "1").

During operation of a 9T memory cell 830 then, data can be written to the 9T memory cell 830 using the corresponding write wordline 880, bitline 882 (blt) and bitline 884 (wblc). Data is read from a 9T memory cell 830 using the corresponding read wordline 890 and the bitline 882, 884 coupled to the 3T read port 840 of the 9T memory cell 830 (for example, data can be read from 9T memory cell 830*b* using bitline 884). Comparing 3T read port 840 of each 9T memory cell with the 2T read port of an 8T memory cell (as depicted in FIG. 2), it will be noticed that 3T read port 840 comprises an additional PMOS transistor. Thus use of an extra PMOS transistor in the read port of 9T memory cell 830 may have a number of advantages, among them serving to avoid charge distribution during read operations and commensurately increasing the stability of 9T memory cell 830.

Figure 9:
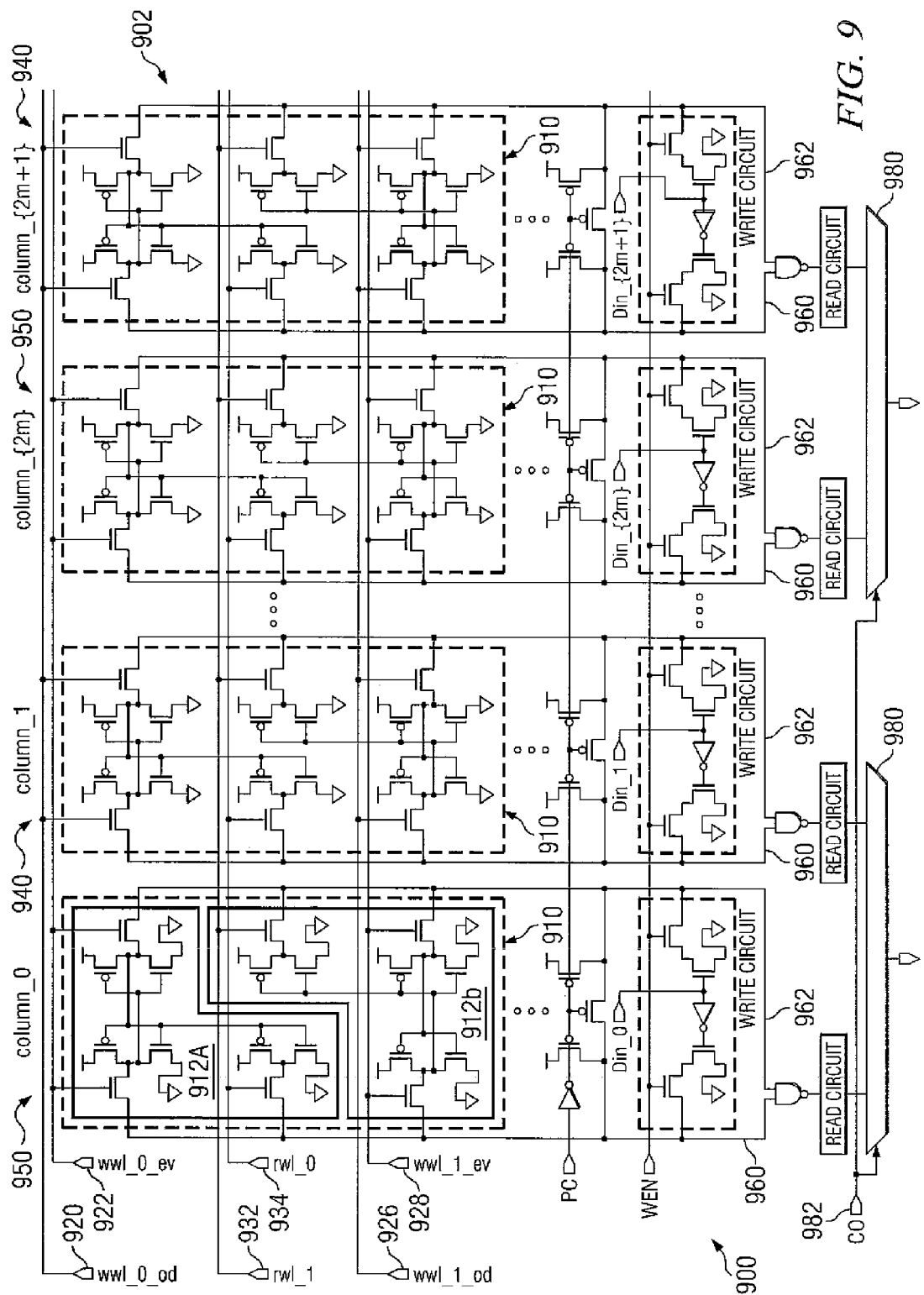
FIG. 9 depicts one embodiment of a memory.

Again it may be helpful to an understanding of certain embodiments to describe in more detail a memory of 9T memory cells created from a layout of transistors according to 6T memory cells. FIG. 9 depicts a schematic diagram of one embodiment of just such a memory. Memory 900 comprises a row 902 of paired 9T memory cells 910, each paired 9T memory cell 910 having two 9T memory cells 912 (referred to as an even 912*a* and an odd 912*b*) where each 9T memory cell 912 is created from a cell of transistors laid out according to a 6T layout and a 3T read port from an adjacent cell of transistors laid out according to a 6T memory cell (as described above with respect to FIG. 8). Here, separate write and read wordlines have been utilized to further reduce the instability of the 9T memory cell. Specifically, write wordline 920 (wwl_0_od) may be coupled to even 9T memory cells 912*a* within paired 9T memory cell 910 in odd numbered columns 940, write wordline 922 (wwl_0_ev) may be coupled to even 9T memory cells 912a within paired 9T memory cells 910 in even numbered columns 950, write wordline 926 (wwl_1_od) may be coupled to odd 9T memory cells 912b within paired 9T memory cells 912 in odd numbered columns 940 and write wordline 928 (wwl_1_ev) may be coupled to odd 9T memory cells 912b within paired 9T memory cells 910 in even numbered columns 950. Similarly, read wordline 932 (rwl_1) may be coupled to odd 9T memory cells 912b within paired 9T memory cells 910 and read wordline 934 (rwl_0) may be coupled to even 9T memory cells 912a within the paired 9T memory cell. Additionally, each column 940, 950 of paired 9T memory cells 910 has two corresponding bitlines 960, 962, where both of the bitline 960 are coupled to the 6T portion of each 9T memory cell 912 and each bitline 960, 962 is also coupled to one of the 3T read ports of a corresponding 9T memory cell 912 (as described above with respect to FIG. 8).

As memory 900 may have a two column structure where it is desired to read from odd columns of memory cells 912 in a row or even columns of memory cells 912 in a row, memory 900 may also comprise multiplexers 980. Each multiplexer is coupled to a corresponding even column 950 and odd column 940 such that depending on the state of column select signal 982, a memory cell 912 in the corresponding even column 950 or odd column 940 can be read.

As can be seen then, in one embodiment, a row 902 of a paired 9T memory cells 910 may utilize 6 wordlines. If, as assumed above, each wordline utilizes one metal wiring track, a row 902 of paired 9T memory cells 910 (e.g. two 9T memory cells) may utilize 6 wiring tracks. While this number of wiring tracks might pose a problem when utilized in association with a typical memory cell layout, the creation of these 9T memory cells from a layout of transistors according to 6T memory cells as described according to embodiment herein may have a number of advantages which may allow the use of this number of wiring tracks, among other advantages.

To begin with, the amount of metal tracks available per 9T memory cell 912 or a row 902 of paired 9T memory cells 910 may be increased relative to a 6T memory cell or an 8T memory cell substantially without reducing transistor density within the memory cell. This situation arises, in general, because the paired 9T memory cells 910 are created from three rows of a 6T cell layout and thus the paired 9T memory cells 910 are generally 3 times higher than the corresponding 6T cells from which they are created. Likewise, then a single 9T memory cell 912 will be 1.5 times higher (and thus encompass 1.5 times the number of metal wiring tracks) as the layout of the 6T memory cells from which they are created.

For example, suppose that in the 6T layout cell layout from which memory 900 was created each 6T cell has a height which encompasses 2.5 metal wiring tracks (as was discussed above). Here the paired 9T memory cell 910 utilized three rows of such a 6T cell layout, meaning that each 9T memory cell 912 is one and half times the height of the 6T cell layout that was used to create the 9T memory cell 912 which, in turn, means that each 9T memory cell 912 encompasses (in this example) 3.75 wiring tracks and each paired 9T memory cell 910 encompasses substantially 7.5 wiring tracks.

Figure 10:
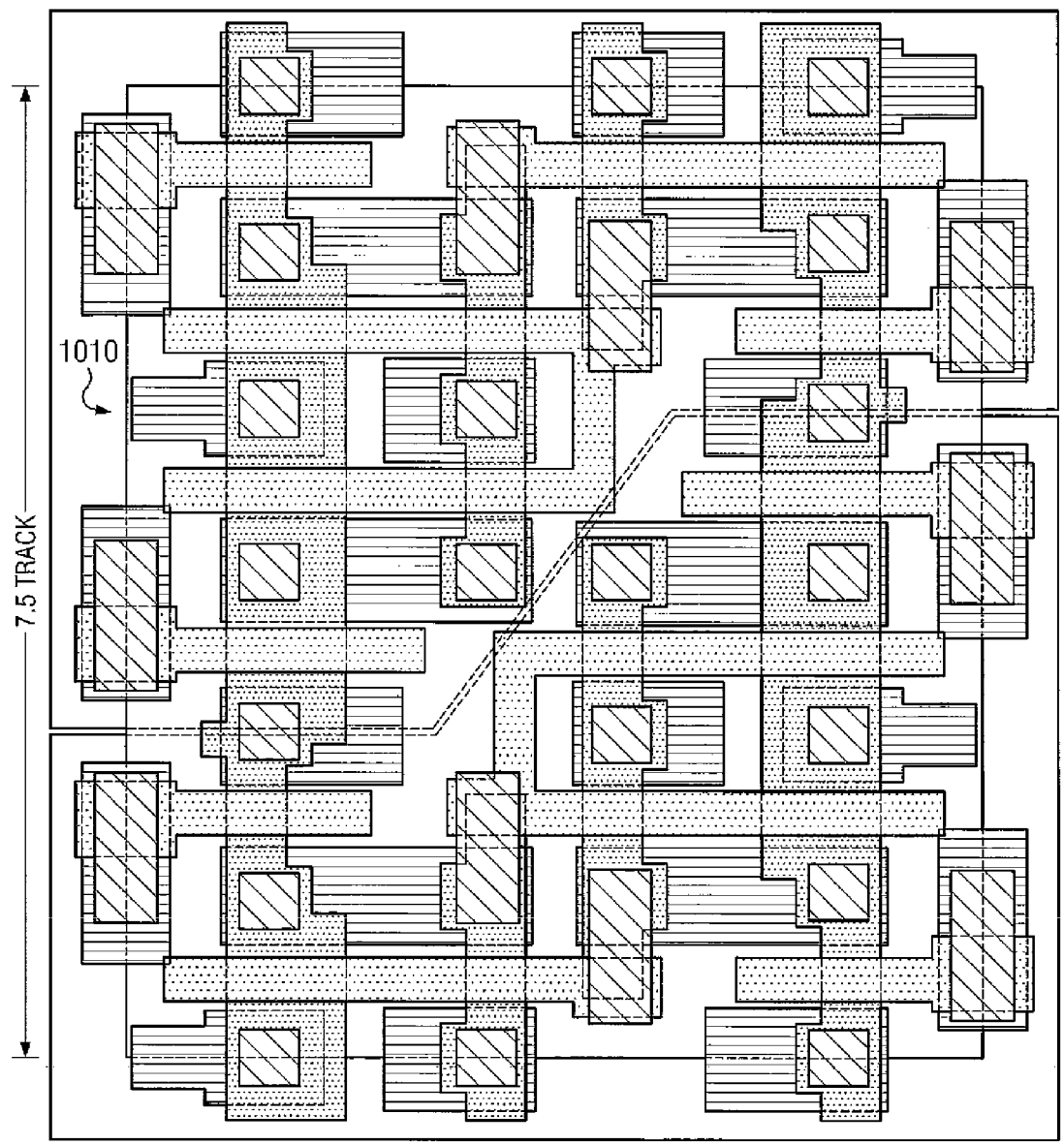
FIG. 10 depicts one embodiment of a layout for memory cells.

This explanation may be more easily understood with reference to FIG. 10 which shows 9T memory cells created from a layout according to 6T memory cells. Notice here that that each row 1010 of paired 9T memory cells encompasses three rows of cells laid out according to a 6T memory cell and thus row 1010 of paired 9T memory cells substantially encompasses 7.5 tracks.

Figure 11:
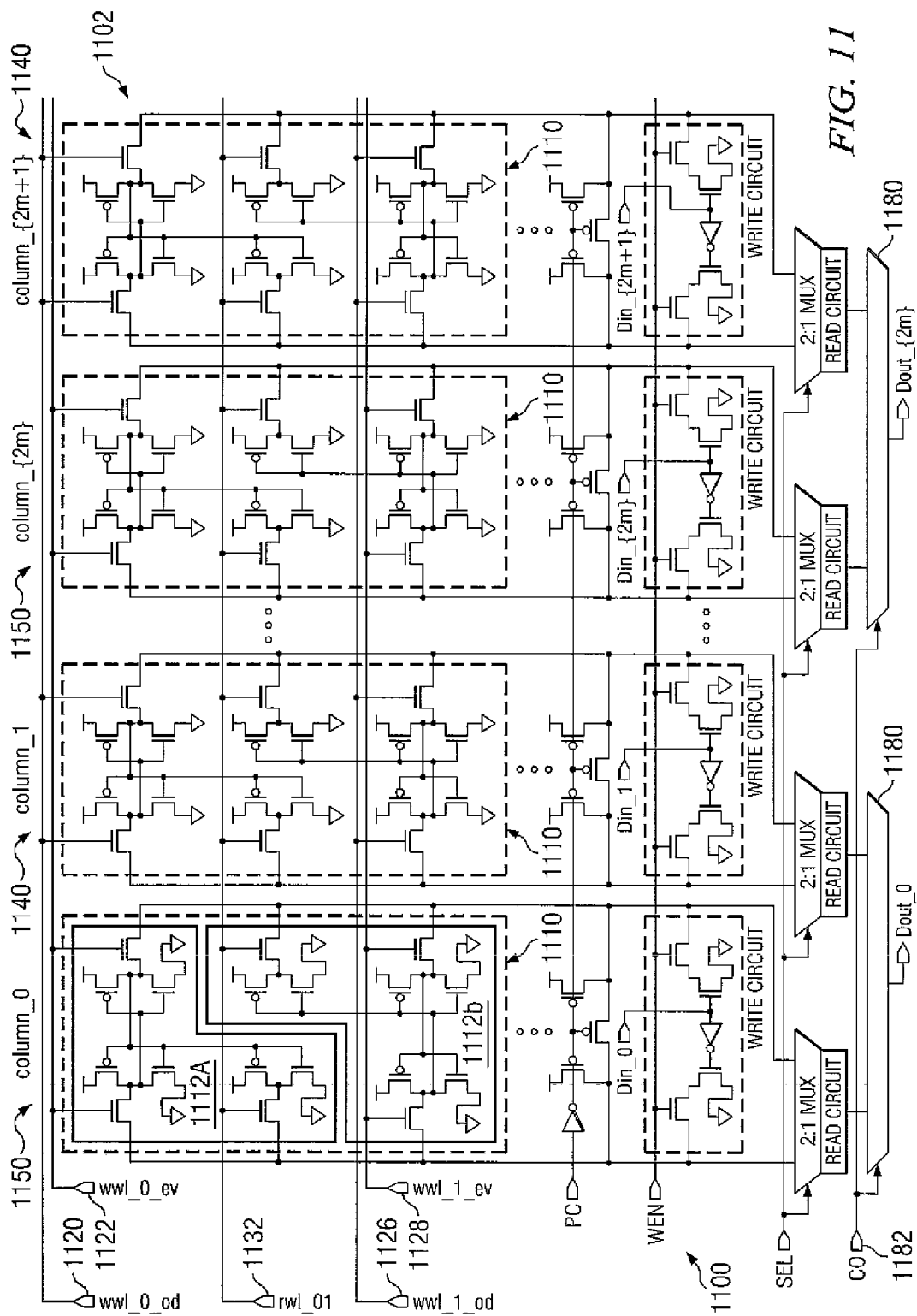
FIG. 11 depicts one embodiment of a memory.

In fact, to further reduce the number of metal wiring tracks which are utilized with a row of paired 9T memory cells, in one embodiment a read wordline may be shared between the even and odd 9T memory cells within each paired 9T memory cell of the row. FIG. 11 depicts a schematic diagram of one embodiment of a memory of this type. Here, memory 1100 comprises a row 1102 of paired 9T memory cells 1110, each paired 9T memory cell 1110 having two 9T memory cells 1112 (referred to as an even 1112a and an odd 1112b) where each 9T memory cell 1112 is created from a cell of transistors laid out according to a 6T layout and a 3T read port from an adjacent cell of transistors laid out according to a 6T memory cell (as described above with respect to FIG. 8).

In this particular embodiment, separate write wordlines have been utilized to further reduce the instability of the 9T memory cell while only a single readline is utilized for row 1102 of paired 9T memory cells 1110. Specifically, write wordline 1120 (wwl_0_od) may be coupled to even 9T memory cells 1112a within paired 9T memory cell 1110 in odd numbered columns 1140, write wordline 1122 (wwl_0_ev) may be coupled to even 9T memory cells 1112a within paired 9T memory cells 1110 in even numbered columns 1150, write wordline 1126 (wwl_1_od) may be coupled to odd 9T memory cells 1112b within paired 9T memory cells 1112 in odd numbered columns 1140 and write wordline 1128 (wwl_1_ev) may be coupled to odd 9T memory cells 1112b within paired 9T memory cells 910 in even numbered columns 950. Read wordline 1132 (rwl_01) may be coupled to every 9T memory cell 912 within each paired 9T memory cells 1110 of row 1102. Thus in this embodiment, a row 1102 of a paired 9T memory cells 1110 may utilize only 5 wordlines.

Again, as memory 1100 may have a two column structure where it is desired to read from odd columns of memory cells 1112 in a row or even columns of memory cells 1112 in a row, memory 1100 may also comprise multiplexers 1180. Each multiplexer is coupled to a corresponding even column 1150 and odd column 1140 such that depending on the state of column select signal 1182, a memory cell 1112 in the corresponding even column 1150 or odd column 1140 can be read.

Figure 12:
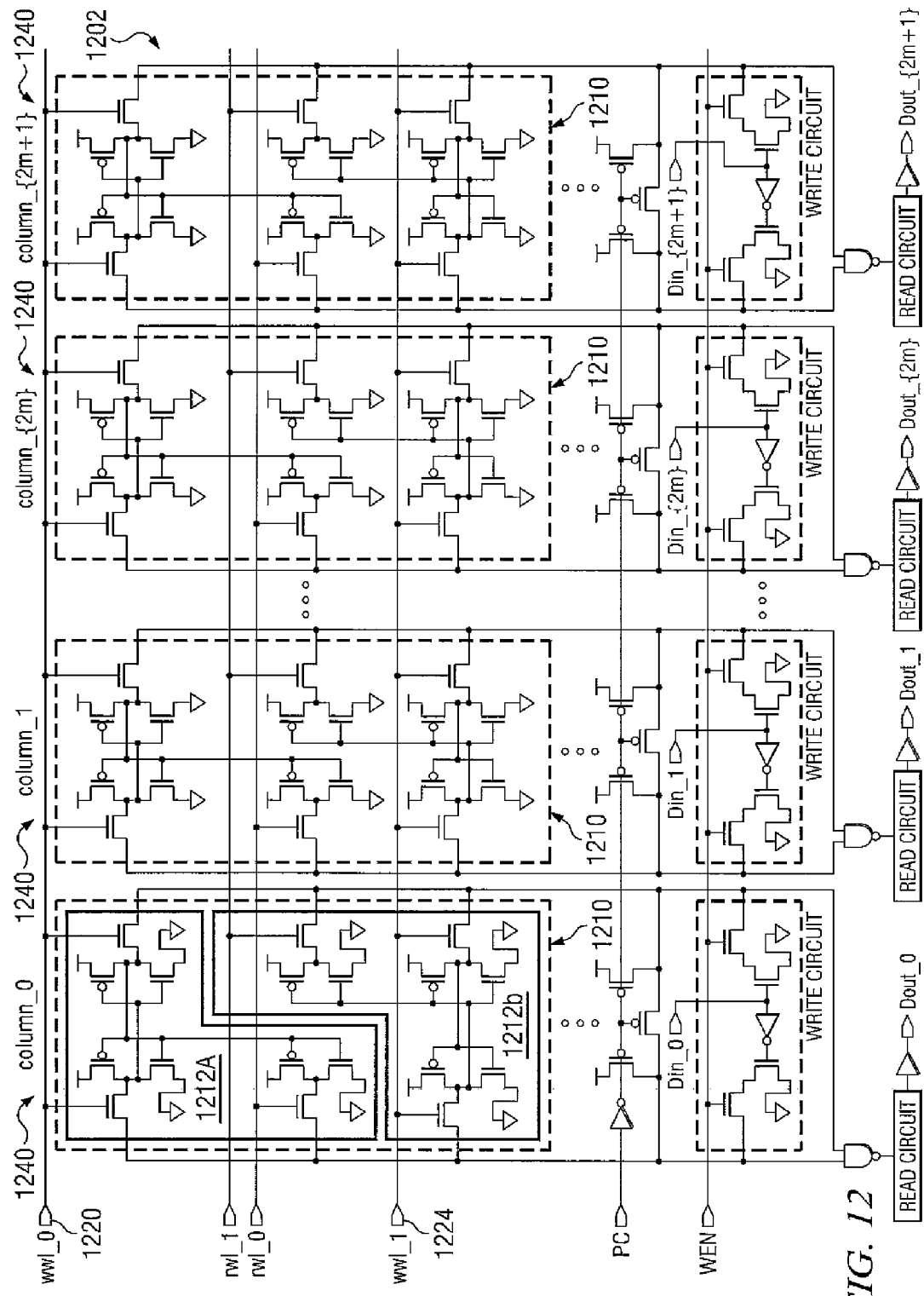
FIG. 12 depicts one embodiment of a memory.

While embodiments such as those discussed in FIGS. 9 and 11 have been described in conjunction with a two column structure it will be apparent that other embodiments may be equally well implemented with respect to a single (or other) column structure, and that similar advantages may accrue to these embodiments as well. To illustrate, with reference first to FIG. 12, a schematic diagram of one embodiment of a memory similar to that depicted in FIG. 9, where a single write wordline is used for each 9T memory cell 1212 within each paired 9T memory cells 1210 of a row 1202 of paired 9T memory cells 1210. Specifically, write wordline 1220 (wwl_0) may be coupled to even 9T memory cells 1212a within paired 9T memory cell 1210 in all columns 1240 of a row 1202 and write wordline 1224 (wwl_1) may be coupled to odd 9T memory cells 1212b within paired 9T memory cells 1212 in all columns 1140 of a row 1202.

Figure 13:
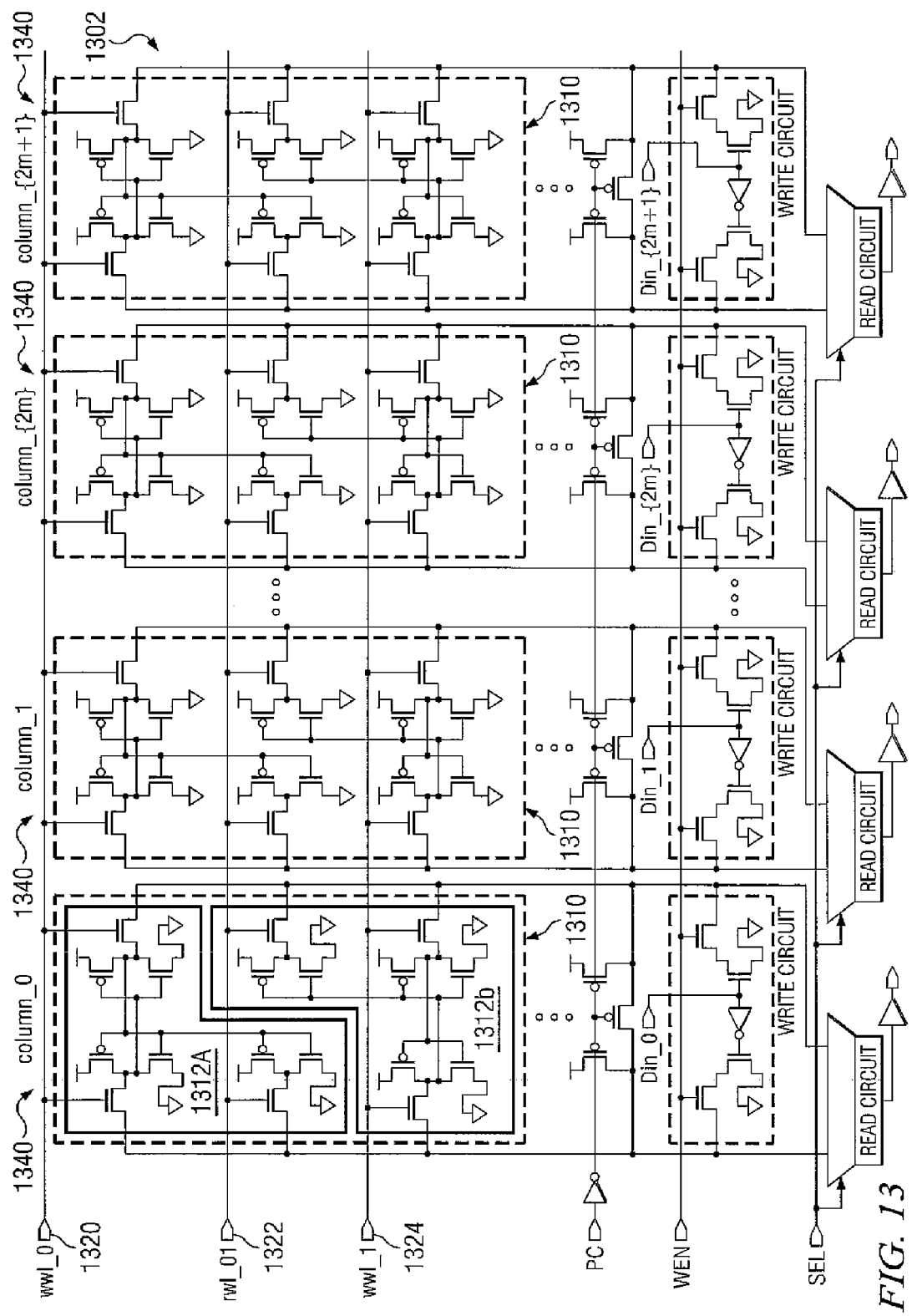
FIG. 13 depicts one embodiment of a memory.

Along the same lines, FIG. 13 depicts a schematic diagram of one embodiment of a memory similar to that depicted in FIG. 11 where a single write wordline is used for each 9T memory cell 1312 within each paired 9T memory cells 1310 of a row 1302 of paired 9T memory cells 1310 and a single read wordline is used for all 9T memory cell 1312 within a row 1302. Specifically, write wordline 1320 (wwl_0) may be coupled to even 9T memory cells 1312a within paired 9T memory cell 1310 in all columns 1340 of a row 1302 and write wordline 1324 (wwl_1) may be coupled to odd 9T memory cells 1312b within paired 9T memory cells 1312 in all columns 1340 of a row 1302. Additionally, read wordline 1322 (rwl_01) may be coupled to all 9T memory cells 1312a within each paired 9T memory cell 1310 in all columns 1340 in the row 1302.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. A memory cell, comprising:
a first 9 transistor (T) memory cell having a first 6T portion comprising a first set of transistors laid out according to a 6T memory cell layout and a first 3T portion comprising a second set of transistors from a second set of transistors laid out according the 6T memory cell layout, wherein the second set of transistors is adjacent to the first set of transistors; and
a second 9T memory cell having a second 6T portion comprising a third set of transistors laid out according to the 6T memory cell layout and a second 3T portion comprising a fourth set of transistors from the second set of transistors laid out according the 6T memory cell layout, wherein the second set of transistors is adjacent to the third set of transistors.

2. The memory cell of claim 1, wherein the first 3T portion is a read port for the first 9T memory cell and the second 3T portion is a read port for the second 9T memory cell.

3. The memory cell of claim 2, wherein each 3T portion comprises a first NMOS transistor, a second NMOS transistor and a first PMOS transistor.

4. The method for manufacturing of claim 1, wherein the first 3T portion is a read port for the first 9T memory cell and the second 3T portion is a read port for the second 9T memory cell.

5. The method for manufacturing of claim 2, wherein each 3T portion comprises a first NMOS transistor, a second NMOS transistor and a first PMOS transistor.

6. A memory, comprising:
a set of paired 9T memory cells, each pair of 9T memory cells comprising:
a first 9 transistor (T) memory cell having a first 6T portion comprising a first set of transistors laid out according to a 6T memory cell layout and a first 3T portion comprising a second set of transistors from a second set of transistors laid out according the 6T memory cell layout, wherein the second set of transistors is adjacent to the first set of transistors; and
a second 9T memory cell having a second 6T portion comprising a third set of transistors laid out according to the 6T memory cell layout and a second 3T portion comprising a fourth set of transistors from the second set of transistors laid out according the 6T memory cell layout, wherein the second set of transistors is adjacent to the third set of transistors.

7. The memory of claim 6, wherein the first 3T portion is a read port for the first 9T memory cell and the second 3T portion is a read port for the second 9T memory cell.

8. The memory of claim 7, wherein each 3T portion comprises a first NMOS transistor, a second NMOS transistor and a first PMOS transistor.

9. The memory of claim 8, wherein the memory is a grid comprising a set of rows of the paired 9T memory cells, each paired 9T memory cell in a corresponding even or odd column and each row of paired 9T memory cells corresponds to a first write wordline, a second write wordline, a third write wordline, a fourth write wordline, a first read wordline and a second read wordline.

10. The memory of claim 9, wherein the first write wordline is coupled to the first 9T memory cell of each paired 9T memory cell in an odd column of a corresponding row, the second write wordline is coupled to the first 9T memory cell of each paired 9T memory cell in an even column of a corresponding row, the third write wordline is coupled to the second 9T memory cell of each paired 9T memory cell in an odd column of a corresponding row, the fourth write wordline is coupled to the second 9T memory cell of each paired 9T memory cell in an even column of a corresponding row.

11. The memory of claim 10, wherein the first read wordline is coupled to each of the first 9T memory cells of each paired 9T memory cell in a corresponding row and the second read wordline is coupled to each of the second 9T memory cell of each paired 9T memory cell in a corresponding row.

12. The method for manufacturing of claim 10, wherein the first read wordline is coupled to each of the first 9T memory cells of each paired 9T memory cell in a corresponding row and the second read wordline is coupled to each of the second 9T memory cell of each paired 9T memory cell in a corresponding row.

13. The method for manufacturing of claim 9, wherein the first write wordline is coupled to the first 9T memory cell of each paired 9T memory cell in an odd column of a corresponding row, the second write wordline is coupled to the first 9T memory cell of each paired 9T memory cell in an even column of a corresponding row, the third write wordline is coupled to the second 9T memory cell of each paired 9T memory cell in an odd column of a corresponding row, the fourth write wordline is coupled to the second 9T memory cell of each paired 9T memory cell in an even column of a corresponding row.

14. The memory of claim 8, wherein the memory is a grid comprising a set of rows of the paired 9T memory cells, each pair of 9T memory cell is in a corresponding even or odd column and each row of paired 9T memory cells corresponds to a first write wordline, a second write wordline, a third write wordline, a fourth write wordline and a first read wordline.

15. The memory of claim 14, Wherein the first write wordline is coupled to the first 9T memory cell of each paired 9T memory cell in an odd column of a corresponding row, the second write wordline is coupled to the first 9T memory cell of each paired 9T memory cell in an even column of a corresponding row, the third write wordline is coupled to the second 9T memory cell of each paired 9T memory cell in an odd column of a corresponding row, the fourth write wordline is coupled to the second 9T memory cell of each paired 9T memory cell in an even column of a corresponding row and the first read wordline is coupled to the first 9T memory cell and the second 9T memory cell of each paired 9T memory cell in a corresponding row.

16. The method for manufacturing of claim 14, wherein the first write wordline is coupled to the first 9T memory cell of each paired 9T memory cell in an odd column of a corresponding row, the second write wordline is coupled to the first 9T memory cell of each paired 9T memory cell in an even column of a corresponding row, the third write wordline is coupled to the second 9T memory cell of each paired 9T memory cell in an odd column of a corresponding row, the fourth write wordline is coupled to the second 9T memory cell of each paired 9T memory cell in an even column of a corresponding row and the first read wordline is coupled to the first 9T memory cell and the second 9T memory cell of each paired 9T memory cell in a corresponding row.

17. The method for manufacturing of claim 8, wherein the memory is a grid comprising a set of rows of the paired 9T memory cells, each paired 9T memory cell in a corresponding even or odd column and each row of paired 9T memory cells corresponds to a first write wordline, a second write wordline, a third write wordline, a fourth write wordline, a first read wordline and a second read wordline.

18. The method for manufacturing of claim 7, wherein each 3T portion comprises a first NMOS transistor, a second NMOS transistor and a first PMOS transistor.

19. The method for manufacturing of claim 8, wherein the memory is a grid comprising a set of rows of the paired 9T memory cells, each pair of 9T memory cell is in a corresponding even or odd column and each row of paired 9T memory cells corresponds to a first write wordline, a second write wordline, a third write wordline, a fourth write wordline and a first read wordline.

20. The method for manufacturing of claim 6, wherein the first 3T portion is a read port for the first 9T memory cell and the second 3T portion is a read port for the second 9T memory cell.

21. A method for manufacturing a memory cell, comprising:
  forming a first 9 transistor (T) memory cell having a first 6T portion comprising a first set of transistors laid out according to a 6T memory cell layout and a first 3T portion comprising a second set of transistors from a second set of transistors laid out according the 6T memory cell layout, wherein the second set of transistors is adjacent to the first set of transistors; and
  forming a second 9T memory cell having a second 6T portion comprising a third set of transistors laid out according to the 6T memory cell layout and a second 3T portion comprising a fourth set of transistors from the second set of transistors laid out according the 6T memory cell layout, wherein the second set of transistors is adjacent to the third set of transistors.

22. A method for manufacturing a memory, comprising:
  forming a set of paired 9T memory cells, each pair of 9T memory cells comprising:
    forming a first 9 transistor (T) memory cell having a first 6T portion comprising a first set of transistors laid out according to a 6T memory cell layout and a first 3T portion comprising a second set of transistors from a second set of transistors laid out according the 6T memory cell layout, wherein the second set of transistors is adjacent to the first set of transistors; and
    forming a second 9T memory cell having a second 6T portion comprising a third set of transistors laid out according to the 6T memory cell layout and a second 3T portion comprising a fourth set of transistors from the second set of transistors laid out according the 6T memory cell layout, wherein the second set of transistors is adjacent to the third set of transistors.

23. A memory, comprising:
  a set of paired 9T memory cells, each pair of 9T memory cells comprising:
    a first 9 transistor (T) memory cell having a first 6T portion comprising a first set of transistors laid out according to a 6T memory cell layout and a first 3T portion comprising a second set of transistors from a second set of transistors laid out according the 6T memory cell layout, wherein the second set of transistors is adjacent to the first set of transistors; and
    a second 9T memory cell having a second 6T portion comprising a third set of transistors laid out according to the 6T memory cell layout and a second 3T portion comprising a fourth set of transistors from the second set of transistors laid out according the 6T memory cell layout, wherein the second set of transistors is adjacent to the third set of transistors and each paired 9T memory cell is in a corresponding column and each row of paired 9T memory cells corresponds to a first write wordline, a second write wordline, a first read wordline and a second read wordline wherein the first write wordline is coupled to the first 9T memory cell of each paired 9T memory cell in each column of a corresponding row, the second write wordline is coupled to the second 9T memory cell of each paired 9T memory cell each column of a corresponding row, the first read wordline is coupled to each of the first 9T memory cells of each paired 9T memory cell in a corresponding row and the second read wordline is coupled to each of the second 9T memory cell of each paired 9T memory cell in a corresponding row.

24. A memory, comprising:
  a set of paired 9T memory cells, each pair of 9T memory cells comprising:
    a first 9 transistor (T) memory cell having a first 6T portion comprising a first set of transistors laid out according to a 6T memory cell layout and a first 3T portion comprising a second set of transistors from a second set of transistors laid out according the 6T memory cell layout, wherein the second set of transistors is adjacent to the first set of transistors; and
    a second 9T memory cell having a second 6T portion comprising a third set of transistors laid out according to the 6T memory cell layout and a second 3T portion comprising a fourth set of transistors from the second set of transistors laid out according the 6T memory cell layout, wherein the second set of transistors is adjacent to the third set of transistors and each paired 9T memory cell is in a corresponding column and each row of paired 9T memory cells corresponds to a first write wordline, a second write wordline and a read wordline wherein the first write wordline is coupled to the first 9T memory cell of each paired 9T memory cell in each column of a corresponding row, the second write wordline is coupled to the second 9T memory cell of each paired 9T memory cell each column of a corresponding row and the read wordline is coupled to each of the first 9T memory cells and second 9T memory cells of each paired 9T memory cell in a corresponding row.

\* \* \* \* \*